United States Patent [19]

Shigehara et al.

[11] Patent Number: 4,864,304
[45] Date of Patent: Sep. 5, 1989

[54] ANALOG VOLTAGE SIGNAL COMPARATOR CIRCUIT

[75] Inventors: Hiroshi Shigehara; Toshimasa Kawaai, both of Tokyo, Japan

[73] Assignee: Kabushiki Kaisha Toshiba, Kawasaki, Japan

[21] Appl. No.: 97,106

[22] Filed: Sep. 16, 1987

[30] Foreign Application Priority Data

Sep. 16, 1986 [JP] Japan .................. 61-217516

[51] Int. Cl.⁴ ............................................. H03M 1/78
[52] U.S. Cl. ................................. 341/143; 341/154
[58] Field of Search ............... 340/347 AD, 347 CC, 340/347 M; 341/154, 143, 118, 158

[56] References Cited

U.S. PATENT DOCUMENTS 4,532,494  7/1985  Sasaki et al. ................... 340/347

OTHER PUBLICATIONS

Harris Semiconductor Product Catalog (Jul. 1977).

Primary Examiner—William M. Shoop, Jr.
Assistant Examiner—Marc S. Hoff
Attorney, Agent, or Firm—Finnegan, Henderson, Farabow, Garrett & Dunner

[57] ABSTRACT

A D/A converter, which has two output terminals, produces an estimated analog voltage signal from one output terminal which is connected to a comparator. The comparator compares the estimated analog voltage signal with an input analog voltage signal fed from an analog voltage signal source, thereby to produce a signal which corresponds to the difference in the respective values of the two intput analog voltage signals. The estimated analog voltage signal is output from the other output terminal of the D/A converter, which is connected to a load. The D/A converter can produce the analog voltage signal at either output terminal thereof.

4 Claims, 2 Drawing Sheets

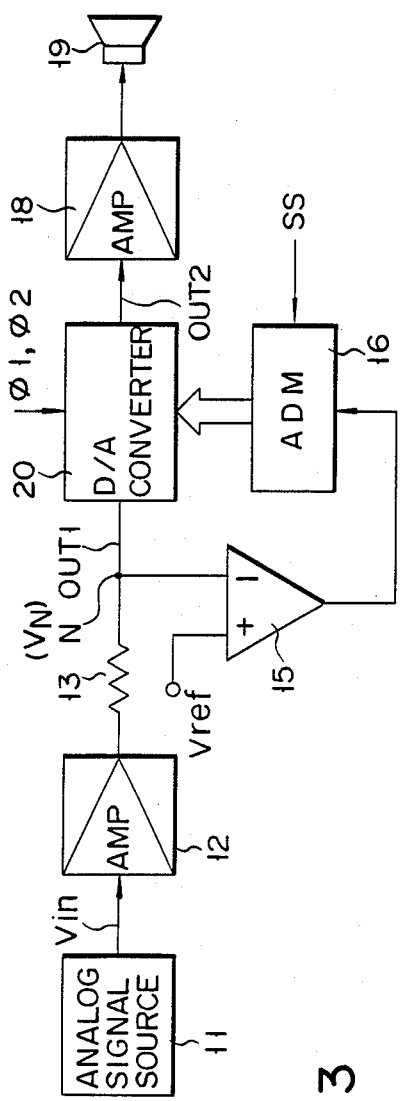
F I G. 3
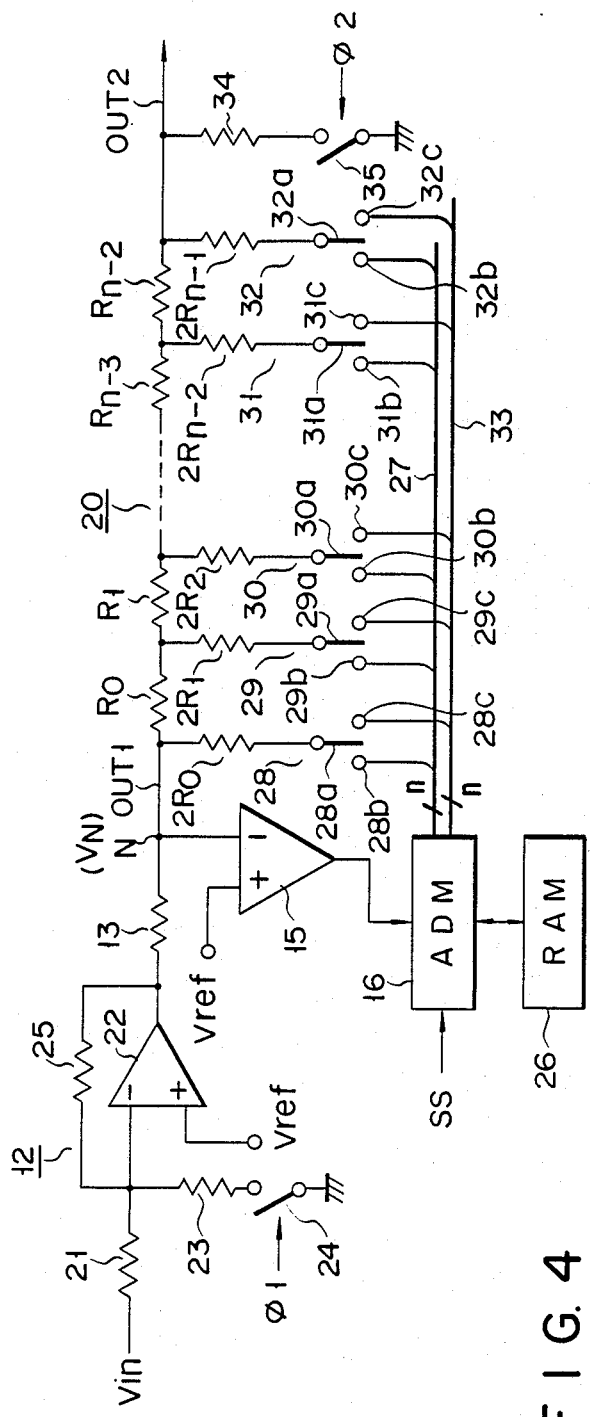
F I G. 4

ANALOG VOLTAGE SIGNAL COMPARATOR CIRCUIT

BACKGROUND OF THE INVENTION

The present invention relates to an analog voltage signal comparator circuit for comparing an input analog voltage signal with an estimated analog voltage signal, in particular, for use in an ADM (Adaptive Delta Modulation) voice synthesizer.

FIG. 1 shows a conventional comparator circuit for comparing an input analog voltage signal with an estimated analog voltage signal, for use in an ADM voice synthesizer. Analog voltage signal source 11—for example—a microphone, receives a voice signal, and supplies an analog voltage signal Vin corresponding to the voice signal to amplifier 12. An output terminal of amplifier 12 is connected via resistor 13 to node N of an output terminal of D/A converter 14 and a non-inverting input terminal (+) of comparator 15. Analog voltage signal $V_N$ on node N is supplied to the non-inverting input terminal (+) of comparator 15. An analog reference voltage Vref is supplied to an inverting input terminal (−) of comparator 15. Comparator 15 compares analog voltage signal $V_N$ with analog reference voltage Vref and outputs the comparison data to ADM (Adaptive Delta Modulation) circuit 16. ADM circuit 16 performs a predetermined arithmetic operation based on the comparison data to produce an estimated value of input voltage signal Vin, and outputs a digital voltage signal of the estimated value. D/A converters 14 and 17 receive the estimated digital signal and convert it into an analog voltage signal. The analog voltage signal output from D/A converter 14 is supplied to node N, and the analog voltage signal output from D/A converter 17 is supplied to speaker 19 via amplifier 18.

The resistance value of resistor 13 is equalized to an impedance of D/A converter 14, obtained when it is viewed from node N.

The analog voltage on node N is determined by the analog output voltage signal of D/A converter 14 and an output analog voltage signal of amplifier 12.

The voltage level of the initial voltage signal SS supplied to ADM circuit 16 is set, for example, 2.5 V, when the estimated voltage of analog voltage signal Vin is 0 V to 5 V. First, a digital voltage signal corresponding to the initial voltage signal is supplied to D/A converter 14. D/A converter 14 converts the digital voltage signal to an analog voltage signal, and then outputs this signal to node N. The input analog voltage signal Vin from analog signal voltage source 11 is supplied to node N via amplifier 12 and resistor 13. Analog volta $V_N$, determined by the output of D/A converter 14 and the output of amplifier 12, is supplied to the non-inverting input terminal (+) of comparator 15. Comparator 15 compares voltage $V_N$ with reference voltage Vref supplied to the inverting input terminal (−) thereof. The comparison data is fed to ADM circuit 16, which performs an arithmetic operation to provide the estimated value of the input analog voltage signal Vin. The result (digital signal) of the arithmetic operation is converted into an analog voltage signal by D/A converter 14. The foregoing operation is repeated.

In the case of taking out the estimated analog voltage signal from whole system, the output of ADM circuit 16 is fed to D/A converter 17 and is amplified by amplifier 18. The amplified signal is supplied to speaker 19, which outputs a voice signal corresponding to the estimated analog voltage signal.

D/A converter 17 is employed in order to take out the estimated analog voltage signal from the whole system. The comparator circuit of FIG. 1 is, however, not suitable for an IC, since the D/A converters require a large area on the IC chip.

FIG. 2 shows an improvement of the circuit of FIG. 1. The numerals as used in FIG. 1 indicate the same elements in FIG. 2. Referring to this Figure, a voltage signal Vin output from analog voltage signal source 11 is fed to a non-inverting input terminal (+) of comparator 15 via amplifier 12. An inverting input terminal (−) of comparator 15 is supplied with output voltage signal $V_N$ of D/A converter 14. Comparator 15 compares voltage signal Vin with voltage signal $V_n$, and supplies the comparison data to ADM circuit 16. ADM circuit 16 feeds a digital voltage signal of an estimated value of the input analog voltage signal to D/A converter 14. Output voltage signal $V_N$ of D/A converter 14 is fed to the inverting input terminal (−) of comparator 15 and also to an input terminal of amplifier 18. Amplifier 18 amplifies voltage signal $V_N$ and feeds it to speaker 19.

As opposed to the structure of FIG. 1, the above-described structure is suitable for an IC, since only one D/A converter is employed, and the area required for the D/A converter can be reduced. However, the characteristics of ADM circuit 16 are restricted by the dynamic range of comparator 15. It is, therefore, necessary to pay attention to the level of the analog voltage signal. Unless the level of the analog voltage signal is specified, the S/N ratio and resolution may be degraded by the restricted characteristics of ADM circuit 16. When a D/A converter which includes a R−2R ladder resistor circuit is used as D/A converter 14, the output thereof varies in a range of the power source voltage. Thus, comparator 15 may be forced to operate in an undesirable range.

As has been described above, in the case of a conventional analog voltage signal comparator circuit, an additional D/A converter is required in order to produce an estimated analog voltage signal. The D/A converter requires a corresponding area on the IC chip. Further, when an estimated analog voltage signal is produced by a single D/A converter, the level of an input analog voltage signal may be restricted by the dynamic range of the comparator, with the result that the S/N ratio and resolution may be degraded.

SUMMARY OF THE INVENTION

The present invention has been developed in consideration of these circumstances, and has its object to provide an analog voltage signal comparator circuit which can produce an estimated analog voltage signal without having to increase the pattern area of the D/A converter deteriorate the S/N ratio and resolution.

So as to achieve the above object, the present invention utilizes an R−2R type D/A converter having two output terminal. An estimated analog voltage signal is fed from one output terminal of the D/A converter to one input terminal of a comparator. An input analog voltage signal from an analog voltage signal source is fed to the input terminal of the comparator via a resistor. A reference voltage is applied to the other input terminal of the comparator. Comparison data is fed to the D/A converter, and the estimated analog voltage signal is produced from the other output terminal of the D/A converter.

An analog voltage signal comparator circuit according to the present invention comprises an analog voltage signal source for supplying an input analog voltage signal, a resistor one end of which receives the input analog voltage signal from the analog voltage signal source, a D/A converter having first and second output terminals, for converting an input digital voltage signal into an analog voltage signal, and, in accordance with a control signal, outputting the converted analog voltage signal via one of the first and second output terminals, the first output terminal being connected to the other end of the resistor, a comparator for comparing a reference voltage with the voltage at a node between the first output terminal of the D/A converter and the other end of the resistor, to produce a comparison result, and arithmetic operation means for performing a predetermined arithmetic operation based on the comparison result obtained by the comparator, producing a digital voltage signal representative of an estimated value of the input analog voltage signal, and supplying the digital signal to the D/A converter, as the input digital voltage signal

BRIEF DESCRIPTION OF THE DRAWINGS

FIG. 3 shows an analog voltage signal comparator circuit according to an embodiment of the present invention; and FIG. 4 shows a detailed circuit diagram of the comparator circuit of FIG. 3.

DETAILED DESCRIPTION OF THE PREFERRED EMBODIMENTS

Figure 1:
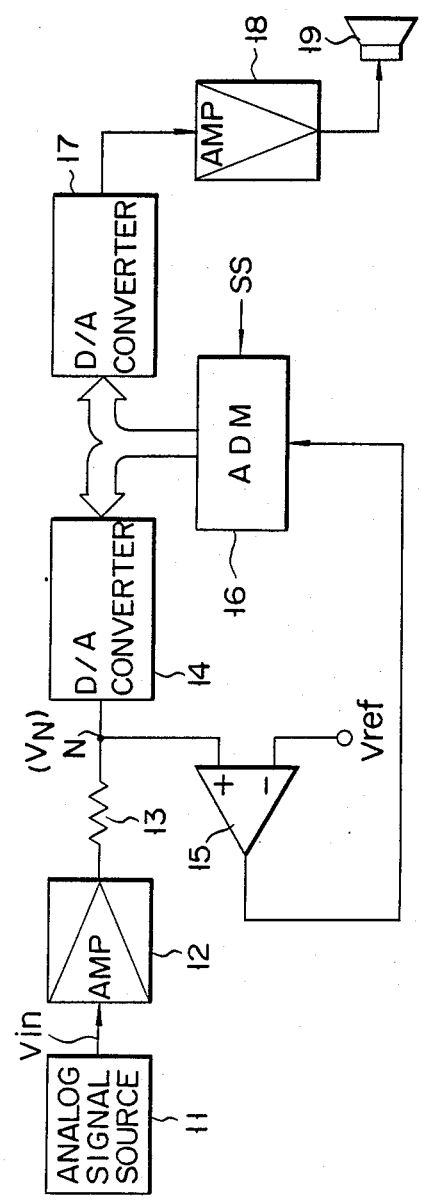
FIG. 1 shows a conventional analog voltage signal comparator circuit.
Figure 2:
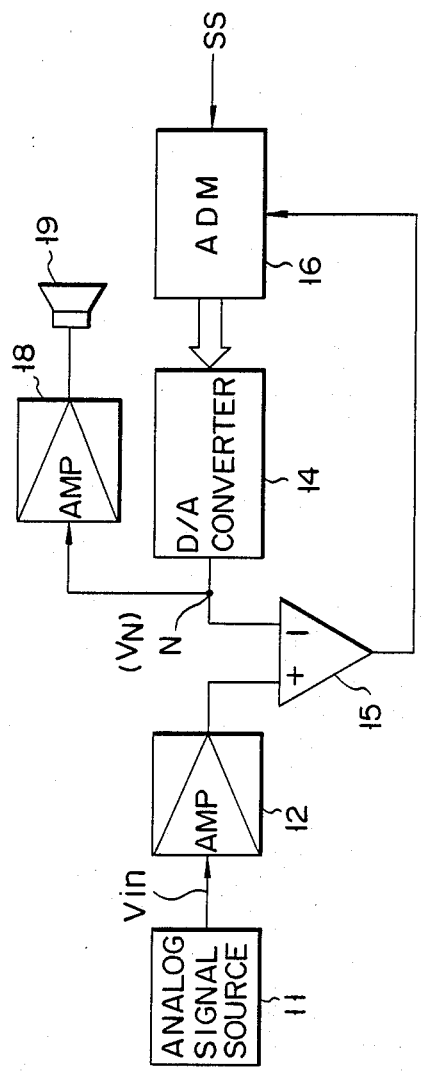
FIG. 2 shows another conventional analog voltage signal comparator circuit.

An embodiment of the present invention will now be described with reference to the accompanying drawings. In FIG. 3, the same numerals as used in FIGS. 1 and 2 indicate the same elements. Analog voltage signal source 11, for example, a microphone, receives a voice signal, and supplies analog voltage signal Vin to amplifier 12. An output terminal of amplifier 12 is connected to one end of resistor 13. The other end of resistor 13 is connected to one output terminal OUT1 of D/A converter 20 and also to an inverting input terminal (−) of comparator 15. The resistance value of resistor 13 is selected to be equal to the impedance $Z_{D/A}$ of D/A converter 20 as viewed from output terminal OUT1 into the inside thereof. Analog voltage signal $V_N$, which is determined by an estimated analog voltage signal fed from terminal OUT1 of D/A converter 20 and analog voltage signal Vin from amplifier 12, is supplied to the inverting input terminal (−) of comparator 15. D/A converter 20, which comprises an R−2R ladder-type resistor circuit, supplies the estimated output analog signal of the input analog signal Vin, from one of two output terminals, selectively, based on a control signal. Reference voltage Vref is applied to a non-inverting input terminal (+) of comparator 15. Comparator 15 compares analog voltage signal $V_N$ with the reference voltage Vref. The comparison data is fed to ADM (Adaptive Delta Modulation) circuit 16. ADM circuit 16 is supplied with an initial voltage signal SS used as an initially estimated analog voltage signal. A digital voltage signal of ADM circuit 16, which is representative of the result of the arithmetic operation, is fed to D/A converter 20. The other output terminal OUT2 of D/A converter 20 is connected to Speaker 19 is connected to amplifier 18 as a load.

The operation of the comparator circuit of FIG. 3 will now be described. ADM circuit 16 is supplied with an initial voltage signal SS used as an initially estimated analog voltage signal. Input analog voltage signal Vin from analog voltage signal source 11 is amplified by amplifier 12. The amplified voltage signal is fed to node N through resistor 13 having a resistance value equal to the impedance of D/A converter 20 as viewed from output terminal OUT 1. Node N also receives the estimated analog voltage signal from terminal OUT1 of D/A converter 20. Voltage $V_N$ at node N determined by input analog voltage signal Vin from amplifier 12 and the estimated analog voltage signal from terminal OUT1 of D/A converter 20 Voltage $V_N$ is applied to the inverting input terminal (−) of comparator 15. The non-inverting input terminal (+) of comparator 15 receives reference voltage Vref. Comparator 15 compares voltage $V_N$ with reference voltage Vref and produces a comparison data. ADM circuit 16 receives the comparison data from comparator 15 and carries out an arithmetic operation to determine an estimated value of the input analog voltage signal Vin. The result of the arithmetic operation is fed to D/A converter 20. The reference voltages for amplifier 12, comparator 15, ADM circuit 16, and D/A converter 20 are equal, though not shown. The output voltage signal of amplifier 12, which corresponds to the input analog voltage signal Vin, and the output voltage signal of D/A converter 20, which corresponds to the estimated analog voltage signal, are made to have the opposite polarities in relation to reference voltage Vref. If the estimation by ADM circuit 16 is correct, voltage $V_N$ at node N becomes equal to reference voltage Vref, and only has a DC component. In fact, however, factors of the D/A converter, such as resolution and arithmetic operation precision, make voltage $V_N$ at node N differ from reference voltage Vref. As a result, voltage $V_N$ at node N1 includes error component $\Delta V$, and becomes equal to (Vref+$\Delta V$). Therefore, the estimated analog voltage signal from ADM circuit 16 is not taken out of node N. In order to take out the estimated analog voltage signal, D/A converter 20 is controlled by a control signal so as to produce the estimated analog voltage signal from terminal OUT2. The signal from terminal OUT2 is amplified by amplifier 18, and fed to speaker 19. Thus, the estimated analog voltage signal (e.g., voice synthesis signal), which corresponds to the output value of ADM circuit 16, can be obtained.

In the above embodiment, an estimated analog voltage signal can be obtained without having to employ two D/A converters. Further, analog signals can be compared irrespective of the dynamic range of the comparator. It is, therefore, not necessary to increase the pattern area. Since the level of an input analog voltage level need not be specified in consideration of the dynamic range of the comparator, the S/N ratio and resolution of the circuit are not deteriorated.

FIG. 4 shows a concrete structure of the circuit of FIG. 3. The same numerals as used in FIG. 3 indicate the same elements. Analog voltage signal Vin is fed from analog voltage signal source 11 (not shown in FIG. 4) to an inverting input terminal (−) of operational amplifier 22 through resistor 21. Resistor 23 and switch 24 are series-connected between the inverting input terminal (−) of operational amplifier 22 and the ground. Reference voltage Vref is applied to a non-inverting input terminal (+) of operational amplifier 22. An output terminal of operational amplifier 22 is connected to one end of resistor 13 and also to the inverting input terminal (−) through resistor 25. Resistors 21 and 25 and operational amplifier 22 constitutes amplifier 12 shown in FIG. 3. The other end of resistor 13 is connected to an inverting input terminal (−) of comparator 15 and also to output terminal OUT1 of R−2R ladder-type resistor circuit (constituting D/A converter 20) comprising resistors R0 to Rn−2 and resistors 2R0 to 2Rn−1. Reference voltage Vref is applied to a non-inverting input terminal (+) of comparator 15. The output voltage signal of comparator 15 is fed to ADM circuit 16. The result of the arithmetic operation performed by ADM circuit 16 is fed to n-bit data bus 27, and is also stored in RAM (random access memory) 26. Movable contacts 28a to 32a of switches 28 to 32 are connected to first contacts of resistors 2R0 to 2Rn−1. First stationary contacts 28b to 32b of switches 28 to 32 are commonly connected to bus 27 of ADM circuit 16, and second stationary contacts 28c to 32c are commonly connected to n-bit data bus 33 of ADM circuit 16. A node between resistor Rn−2 and 2Rn−1 is grounded through resistor 34 and switch 35. The sum of the resistances of resistors 13, 21, 23, and 25 is set to 2R.

The comparator circuit shown in FIG. 4 operates as follows. Switches 24 and 35 are alternately turned on/-off by a control signal in order to switch the output terminals from which D/A converter 20 supplies an output signal. Suppose that switch 35 is turned on and switch 24 is turned off, and that movable contacts 28a to 32a of switches 28 to 32 are connected to stationary contacts 28b to 32b. In this case, the estimated digital voltage signal, fed from ADM circuit 16 through bus 27, is converted by D/A converter 20 into the estimated analog voltage signal. Voltage $V_N$ at node N is compared with reference voltage Vref by comparator 15. The comparison data is fed to ADM circuit 16. ADM circuit 16 performs an arithmetic operation for determining an estimated voltage value of input analog voltage signal Vin. Then, ADM circuit 16 produces a digital voltage signal indicative of the estimated value. This digital signal is fed to D/A converter 20 and, simultaneously, stored in RAM 26.

When the estimated analog voltage signal is to be taken out, switch 24 is turned on and switch 35 is turned off. Furthermore, movable contacts 28a to 32a are connected to stationary contacts 28c to 32c so that data stored in RAM 26 is supplied to contacts 28a to 32a via data bus 33. D/A converter 20 outputs an estimated analog voltage signal from terminal OUT2. The estimated analog voltage signal is amplified by amplifier 18 (not shown in FIG. 4) and supplied to speaker 19 (not shown in FIG. 4). Speaker 19 is driven by the estimated analog voltage signal, thus producing a synthesis output corresponding to the estimated analog voltage signal. In order to eliminate the influence of the output of operational amplifier 22 upon the synthesis output, it is desirable to keep high the impedance of the output terminal of operational amplifier 22 by using a power down signal.

As described above, the present invention provides an analog voltage signal comparator circuit which can produce an estimated analog voltage signal including a smallest possible error component, without having to increase the pattern area or to deteriorate the S/N ratio and resolution of the circuit.

What is claimed is:

1. An analog voltage signal comparator circuit comprising:
   an analog voltage signal source for supplying an input analog voltage signal;
   a resistor one end of which receives the input analog voltage signal from said analog voltage signal source;
   a D/A converter having first and second output terminals, for converting an input digital voltage signal into an analog voltage signal, and outputting the converted analog voltage signal via one of the first and second output terminals, in accordance with a control signal, said first output terminal being connected to the other end of said resistor;
   a comparator for comparing a reference voltage with the voltage at a node between said first output terminal of the D/A converter and said other end of said resistor to produce a comparison result; and
   arithmetic operation means for performing a predetermined arithmetic operation based on the comparison result obtained by said comparator, producing a digital voltage signal representative of an estimated value of said input analog voltage signal, and supplying the digital signal to said D/A converter, as said input digital voltage signal.

2. An analog voltage signal comparator circuit according to claim 1, wherein said D/A converter includes an R−2R ladder-type resistor circuit, which receives the digital signal from said arithmetic operation means, a first circuit, which is connected between one end of the ladder-type resistor circuit and the ground and includes a first resistor and a first switch which are series-connected, and a second circuit, which is connected between the other end of the ladder-type resistor circuit and the ground, and includes a second resistor and a second switch which are series-connected, said first and second switches being selectively turned on/-off according to the control signal, so that said converted analog voltage signal is output from that end of the ladder-type resistor circuit to which said turned-off switch is connected.

3. An analog voltage signal comparator circuit according to claim 1, wherein the resistance value of said resistor and that of said D/A converter, obtained when it is viewed from said first output terminal thereof, are substantially equal.

4. An analog voltage signal comparator circuit according to claim 1, wherein said analog voltage signal source is a microphone.

* * * * *